(12) United States Patent
Lee et al.

(10) Patent No.: US 9,411,696 B2
(45) Date of Patent: Aug. 9, 2016

(54) SEMICONDUCTOR MEMORY DEVICE AND METHOD OF OPERATING THE SAME

(71) Applicant: SK hynix Inc., Gyeonggi-do (KR)

(72) Inventors: Sang Kyu Lee, Chungcheongbuk-do (KR); Chang Geun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 87 days.

(21) Appl. No.: 14/282,931

(22) Filed: May 20, 2014

(65) Prior Publication Data

US 2015/0135040 A1 May 14, 2015

(30) Foreign Application Priority Data

Nov. 14, 2013 (KR) ........................ 10-2013-0138532

(51) Int. Cl.
G11C 29/00 (2006.01)
G06F 11/16 (2006.01)
G06F 11/20 (2006.01)

(52) U.S. Cl.
CPC ............ *G06F 11/1666* (2013.01); *G11C 29/72* (2013.01); *G11C 29/76* (2013.01); *G06F 11/20* (2013.01)

(58) Field of Classification Search
CPC ....... G06F 11/167; G06F 11/20; G11C 29/72; G11C 29/76
See application file for complete search history.

(56) References Cited

U.S. PATENT DOCUMENTS

| | | | | | |
|---|---|---|---|---|---|
| 5,550,394 A | * | 8/1996 | Sukegawa | ............... | G11C 29/78 257/209 |
| 6,201,733 B1 | * | 3/2001 | Hiraki | .................... | G11C 16/06 365/185.08 |
| 6,449,199 B2 | * | 9/2002 | Hidaka | ................ | G11C 29/808 365/200 |
| 6,552,939 B1 | * | 4/2003 | Miki | ................ | G11C 29/50016 365/185.09 |
| 6,912,155 B2 | * | 6/2005 | Sakurai | ................ | G11C 16/225 365/185.02 |
| 7,149,135 B2 | * | 12/2006 | Okuno | ................ | G11C 29/802 365/185.08 |
| 7,394,689 B2 | | 7/2008 | Ryu | | |
| 7,764,553 B2 | * | 7/2010 | Riho | ........................ | G11C 8/06 365/185.09 |
| 7,978,549 B2 | * | 7/2011 | Jeong | ..................... | G11C 17/16 365/189.05 |
| 8,059,464 B2 | * | 11/2011 | Kwak | ................. | G11C 11/5628 365/185.03 |
| 8,208,334 B2 | * | 6/2012 | Wong | ....................... | G11C 7/02 365/222 |
| 8,289,790 B2 | * | 10/2012 | Rooney | .................... | G11C 17/18 365/200 |
| 9,128,822 B2 | * | 9/2015 | Michael | ............... | G06F 12/0246 |
| 2004/0078701 A1 | * | 4/2004 | Miyanishi | ............ | G11C 29/806 714/42 |

* cited by examiner

*Primary Examiner* — Esaw Abraham
(74) *Attorney, Agent, or Firm* — IP & T Group LLP

(57) ABSTRACT

A semiconductor memory device includes a memory cell array having a first group of main blocks, a second group of main blocks and redundancy blocks replacing the first group of main blocks or the second group of main blocks, a repair logic suitable for enabling a replacement signal when one or more of the second group of main blocks are defective, a control logic suitable for generating an address for the second group of main blocks in response to a dedicated command for access to one or more of the second group of main blocks, and an address decoder suitable for selecting one or more of the redundancy blocks based on the address for the second group of main blocks when the replacement signal is enabled.

9 Claims, 7 Drawing Sheets

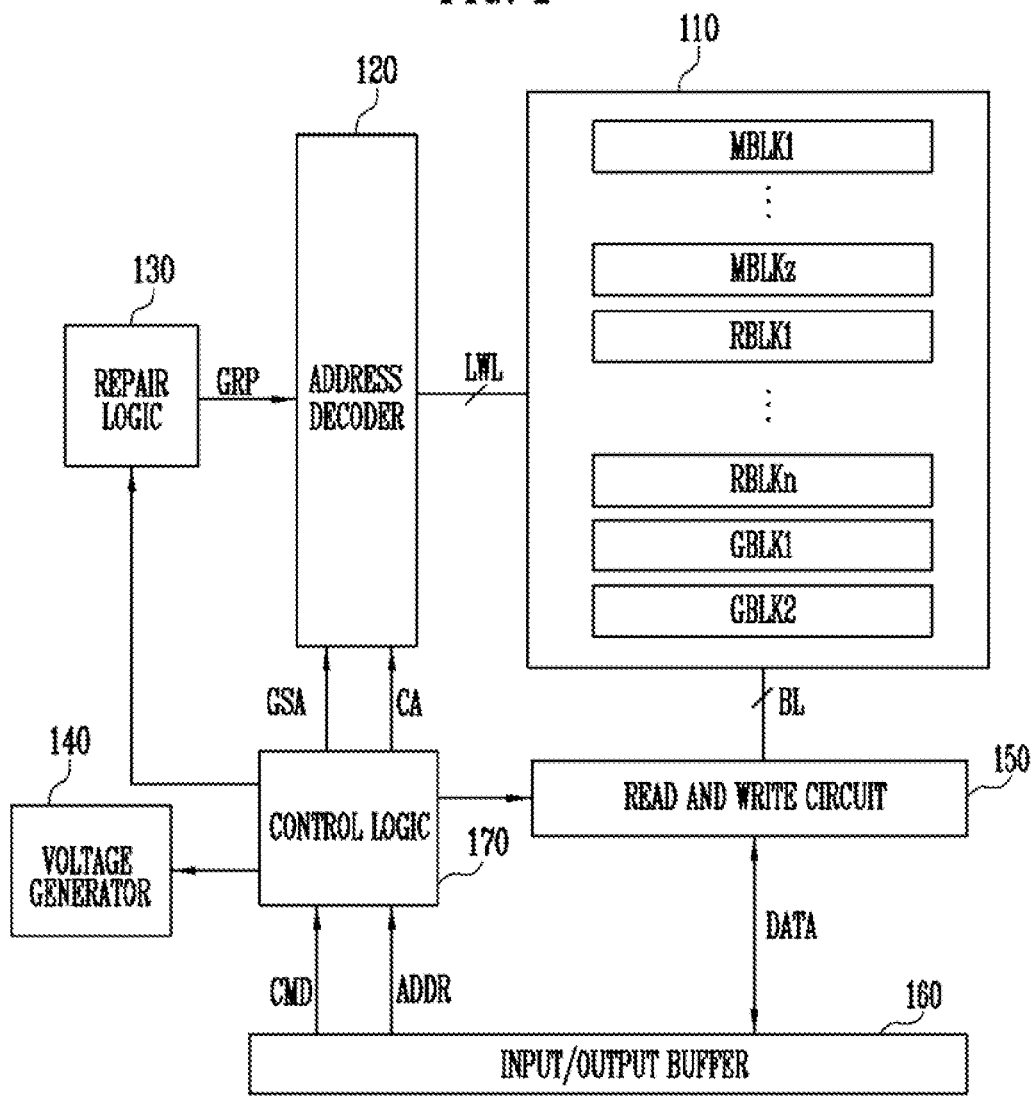
FIG. 1
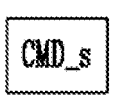
FIG. 2

SEMICONDUCTOR MEMORY DEVICE AND METHOD OF OPERATING THE SAME

CROSS-REFERENCE TO RELATED APPLICATION

The present application claims priority to Korean patent application number 10-2013-0138532, filed on Nov. 14, 2013, the entire disclosure of which is incorporated herein in its entirety by reference.

BACKGROUND

1. Field of Invention

Various exemplary embodiments of the present invention relate generally to an electronic device, a id more particularly, to a semiconductor memory device and a method of operating the same.

2. Description of Related Art

With the surge in usage of mobile information devices using semiconductor memory devices as storage media, especially smartphones and tablets, these semiconductor memory devices have gained increasing interest and importance. The emergence of a wide range of applications as well as a high-speed processor or multi-core parallelism has required increased performance and reliability of semiconductor memory devices.

A semiconductor memory device is a so age device that is realized using a semiconductor made from, for example, silicon (Si), germanium (Ge), gallium arsenide (GaAs), or indium phosphide (InP). Semiconductor memory devices can be classified as volatile memory devices or nonvolatile memory devices. A volatile memory device is unable to retain stored data when the power is turned off. Volatile memory devices include static random access memory (SRAM) device, dynamic RAM (DRAM) device, synchronous DRAM (SDRAM) device, or the like. A non-volatile memory device can retain stored data even when powered off. Non-volatile memory devices may include read only memory (ROM) device, programmable ROM (PROM) device, electrically programmable ROM (EPROM) device, electrically erasable and programmable ROM (EEPROM) device, flash memory device, phase-change RAM (PRAM) device, magnetic RAM (MRAM) device, resistive RAM (RRAM) device, ferroelectric RAM (FRAM) device, or the like. A flash memory device may be classified as a NOR type or a NAND type.

A non-volatile memory device may include a plurality of memory blocks. Defective blocks among the plurality of memory blocks may be generated due to errors in the manufacturing process. A non-volatile memory device having a predetermined number or less defective blocks may be treated as normal.

However, specific memory blocks that may store security data, memory device ID information for example, should not be defective. Non-volatile memory devices having defects in specific memory blocks may be treated as failed regardless of the total number of defective blocks. This may result in reduced production yield of non-volatile memory devices.

SUMMARY

Exemplary embodiments of the present invention are directed to increasing the production yield of semiconductor memory devices.

A semiconductor memory device according to an embodiment of the present invention may include a memory cell array including a first group of main blocks, a second group of main blocks and redundancy blocks replacing the first group of main blocks or the second group of main blocks; a repair logic suitable for enabling a replacement signal when one or more of the second group of main blocks are defective; a control logic suitable for generating an address for the second group of main blocks in response to a dedicated command for access to one or more of the second group of main blocks; and an address decoder suitable for selecting one or more of the redundancy blocks based on the address for the second group of main blocks when the replacement signal is enabled, and selecting one or more of the redundancy blocks based on an address for the first group of main blocks according to defects of the first group of main blocks when the replacement signal is disabled.

A semiconductor memory device according to another embodiment of the present invention may include a first group of main blocks, a second group of main blocks and redundancy blocks, a guarantee block controller suitable for receiving a guarantee block selection address and transferring a decoded guarantee block selection address through guarantee block control lines, a router including a first input terminal coupled to the guarantee block control lines, a first output terminal coupled to redundancy block selection lines and a second output terminal coupled to guarantee block selection lines, a redundancy block controller suitable for selecting one of the redundancy blocks in response to first signals input through the redundancy block selection lines, and a guarantee block selector suitable for selecting one of the second group of main blocks in response to second signals input through the guarantee block selection lines, wherein the router transfers the decoded guarantee block selection address as the first signals to the redundancy block selection fines in response to a replacement signal.

An embodiment of the present invention may include a method of operating a semiconductor memory device which has main blocks and redundancy blocks that replace the main blocks. This method may further include receiving a command from an external device, determining whether the command is for access to predetermined part of the main blocks, generating a guarantee block selection address indicating the predetermined part of the main blocks depending on a result of determination, and selecting one of the redundancy blocks according to the guarantee block selection address in response to a replacement signal enabled when one or more of the predetermined parts of the main blocks are defective.

BRIEF DESCRIPTION OF THE DRAWINGS

FIG. 1 is a block diagram illustrating a semiconductor memory device according to an embodiment of the present invention;

FIG. 2 is a conceptual view illustrating signal sequences for access to main and guarantee blocks;

DETAILED DESCRIPTION

Figure 3:
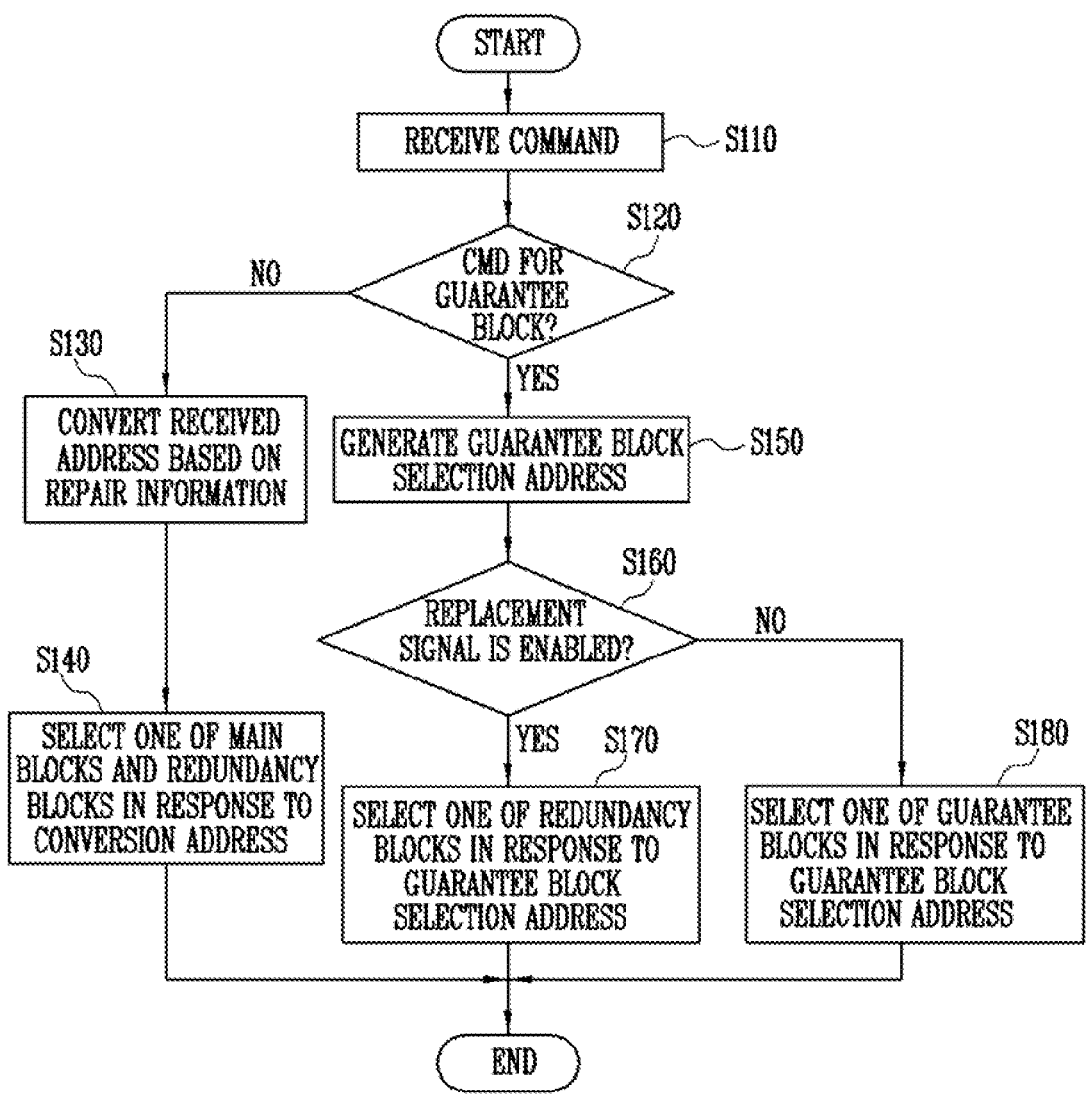
FIG. 3 is a flowchart illustrating a method of operating a semiconductor memory device according to an embodiment of the present invention.

Various exemplary embodiments of the present invention will be described in detail with reference to the accompanying drawings. The figures are provided to enable those of ordinary skill in the art to make and use the present invention according to the exemplary embodiments of the present invention.

Throughout the disclosure, reference numerals correspond directly to the like numbered parts in the various figures and embodiments of the present invention. Also, in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a semiconductor memory device 100 according to an embodiment of the present invention.

Referring to FIG. 1, the semiconductor memory device 100 may include a memory cell array 110, an address decoder 120, a repair logic 130, a voltage generator 140, a read and write circuit 150, an input/output buffer 160 and a control logic 170.

The memory cell array 110 may include a plurality of memory blocks MBLK1 to MBLKz, RBLK1 to RBLKn, GBLK1 and GBLK2. The memory blocks MBLK1 to MBLKz, RBLK1 to RBLKn, GBLK1 and GBLK2 may be coupled to the address decoder 120 through local word lines LWL. The memory blocks MBLK1 to MBLKz, RBLK1 to RBLKn, GBLK1 and GBLK2 may be coupled to the read and write circuit 150 through bit lines BL. Each of the memory blocks MBLK1 to MBLKz, RBLK1 to RBLKn, GBLK1 and GBLK2 may include a plurality of memory cells. According to an embodiment, the plurality of memory cells may be non-volatile memory cells.

An erase operation of the semiconductor memory device 100 may be performed in units of memory blocks. Read and program operations of the semiconductor memory device may be performed in units of local word lines.

The memory blocks MBLK1 to MBLKz, RBLK1 to RBLKn, GBLK1 and GBLK2 may comprise main blocks MBLK1 to MBLKz, redundancy blocks RBLK1 to RBLKn and guarantee blocks GBLK1 and GBLK2.

The redundancy blocks RBLK1 to RBLKn may replace the main blocks MBLK1 and MBLK2 and the guarantee blocks GBLK1 and GBLK2.

An external device (not illustrated) may access the guarantee blocks GBLK1 and GBLK2 and the main blocks MBLK1 to MBLKz, for example, after a test operation of the semiconductor memory device 100. The semiconductor memory device 100 may program the guarantee blocks GBLK1 and GBLK2 and the main blocks MBLK1 to MBLKz with data, and may read data stored in the guarantee blocks GBLK1 and GBLK2 and the main blocks MBLK1 to MBLKz in response to a request from an external device.

The semiconductor memory device 100 having a predetermined or less number of defective blocks among the main blocks MBLK1 to MBLKz may be treated as normal. As widely known, the defective main block may be replaced by one of the redundancy memory blocks RBLK1 to RBLKn, or may remain invalid without replacement.

On the other hand, a semiconductor memory device 100 having a defective guarantee block GBLK1 and GBLK2 may be treated as failed regardless of the total number of defective main blocks unless the defective guarantee block is replaced by one of the redundancy blocks RBLK1 to RBLKn. According to an embodiment, the guarantee blocks GBLK1 and GBLK2 may store ID of the semiconductor memory device 100, for example, security data such as the manufacturer's serial number and the manufacture date. The guarantee blocks GBLK1 and GBLK2 may be one-time programmable (OTP) memory blocks, which are programmed with data once and the stored data is not lost.

One or more of the main blocks MBLK1 to MBLKz may store repair information. The repair information may represent that a defective memory block is to be replaced by one of the redundancy blocks RBLK1 to RBLKn. After the semiconductor memory device 100 is manufactured, it may be tested to determine whether a defective main block is present among the main blocks MBLK1 to MBLKz. As a result, the repair information may be stored in one or more of the main blocks MBLK1 to MBLKz.

The repair information may be loaded into the control logic 170. The control logic 170 may generate a converted address CA based on an externally input address ADDR to access the main blocks MBLK1 to MBLKz. When the externally input address ADDR represents a defective main block among the main blocks MBLK1 to MBLKz, the control logic 170 may convert the externally input address ADDR to the converted address CA representing one of the redundancy blocks RBLK1 to RBLKn according to the repair information, in which case the redundancy block corresponding to the converted address CA may take the place of the defective main block represented by the externally input address ADDR. The control logic 170 may output the externally input address ADDR as the converted address CA when the externally input address ADDR represents a normal main block.

The address decoder 120 may be coupled to the memory blocks MBLK1 to MBLKz, RBLK1 to RBLKn, GBLK1 and GBLK2 through the local word lines LWL. The address decoder 120 may be controlled by the control logic 170.

The address decoder 120 may receive the converted address CA from the control logic 170. A block address in the converted address CA may indicate the main blocks MBLK1 to MBLKz or the redundancy blocks RBLK1 to RBLKn. The address decoder 120 may decode the block address in the converted address CA and select one of the main blocks MBLK1 to MBLKz and the redundancy blocks RBLK1 to RBLKn based on the decoded block address.

In addition, the address decoder 120 may decode a row address in the converted address CA. The address decoder 120 may select one of the local word lines LWL, which is coupled to the selected main block, based on the decoded row address.

The control logic 170 may generate a guarantee block selection address GSA indicating one of the guarantee blocks GBLK1 and GBLK2 in response to an externally input command for access to one of the guarantee blocks GBLK1 and GBLK2. The address decoder 120 may receive the guarantee block selection address GSA from the control logic 170.

According to an embodiment of the present invention, when one or more of the guarantee blocks GBLK1 and GBLK2 are defective, the address decoder 120 may decode the guarantee block selection address GSA and select one of the redundancy blocks RBLK1 to RBLKn based on the decoded guarantee block selection address in order to substitute the selected redundancy block for the defective guarantee block. According to an embodiment, when two guarantee blocks GBLK1 and GBLK2 are provided, two redundancy blocks (e.g., RBLK1 and RBLK2) may be reserved commonly for the main blocks MBLK1 to MBLKz and the guarantee blocks GBLK1 and GBLK2, and the other redundancy blocks (e.g., RBLK3 to RBLKn) may be reserved for the main blocks MBLK1 to MBLKz.

The address decoder 120 may receive a replacement signal GRP that is enabled by the repair logic 130, which will be described later, when one or more of the guarantee blocks GBLK1 and GBLK2 are defective. The address decoder 120 may select one of the redundancy blocks RBLK1 to RBLKn reserved for the guarantee blocks GBLK1 and GBLK2, instead of the guarantee blocks GBLK1 and GBLK2, in response to the guarantee block selection address GSA, and the enabled replacement signal GRP. For example, when the guarantee block selection address GSA indicating the first guarantee block GBLK1 is provided, the first redundancy block RBLK1 may be selected in response to the enabled replacement signal GRP. When the guarantee block selection address GSA indicating the second guarantee block GBLK2 is provided, the second redundancy block RBLK2 may be selected in response to the enabled replacement signal GRP.

When the replacement signal GRP is disabled, the address decoder 120 may select one of the guarantee blocks GBLK1 and GBLK2 in response to the decoded guarantee block selection address.

As a result, when one of the guarantee blocks GBLK1 and GBLK2 is defective, the address decoder 120 may select a redundancy block for the defective guarantee block in response to the replacement signal GRP in order to substitute the selected redundancy block for the defective guarantee block.

The repair logic 130 may be controlled by the control logic 170. The repair logic 130 may generate and transfer the replacement signal GRP to the address decoder 120. The repair logic 130 may enable the replacement signal GRP when one or more of the guarantee blocks GBLK1 and GBLK2 are defective.

According to an embodiment, information about which one of the guarantee blocks GBLK1 and GBLK2 is defective may be stored as setup information in one of the main blocks MBLK1 to MBLKz. The setup information may be loaded into the repair logic 130 when the semiconductor memory device 100 is powered on, and the repair logic 130 may generate and selectively enable the replacement signal GRP based on the loaded setup information.

According to an embodiment, the repair logic 130 may include an E-fuse. The E-fuse may be cut depending on which one of the guarantee blocks GBLK1 and GBLK2 is defective, and accordingly the replacement signal GRP may be enabled or disabled.

The voltage generator 140 may generate a plurality of voltages by using an external voltage applied to the semiconductor memory device 100. The voltage generator 140 may be controlled by the control logic 170. The voltage generator 140 may generate a plurality of voltages by regulating the external voltage or amplifying the external voltage by using a plurality of pumping capacitors. These voltages may be provided to the address decoder 120, the repair logic 130, the read and write circuit 150, the input/output buffer 160 and the control logic 170.

The read and write circuit 150 may be coupled to the memory blocks MBLK1 to MBLKz, RBLK1 to RBLKn, GBLK1 and GBLK2 through the bit lines BL. The read and write circuit 150 may be coupled to the input/output buffer 160. The read and write circuit 150 may be controlled by the control logic 170.

During the read and program operations, the ad and write circuit 150 may exchange data DATA with the input/output buffer 160.

During the program operation, the read and write circuit 150 may receive the data DATA from an external device through the input/output buffer 160, and program memory cells of a selected local word line with the data DATA through the bit lines BL. During the read operation the read and write circuit 150 may read the data DATA from the memory cells of the selected local word line through the bit lines BL and output the data DATA to the external device through the input/output buffer 160.

According to an exemplary embodiment of the present invention, the read and write circuit 158 may include page buffers or page registers.

The input/output buffer 160 may be coupled to the read and write circuit 150 and the control logic 170. The input/output buffer 160 may be controlled by the control logic 170. The input/output buffer 160 may transfer a command CMD and the address ADDR, which are from the external device, to the control logic 170. In addition, the input/output buffer 160 may transfer the data DATA between the external device and the read and write circuit 150.

The control logic 170 may operate in response to the command CMD and the address ADDR input from the external device through the input/output buffer 160.

The command CMD may be a normal command for access to the main blocks MBLK1 to MBLKz or a special command for access to the guarantee blocks GBLK1 and GBLK2.

FIG. 2 is a conceptual view illustrating signal sequences for access to the main and guarantee blocks.

Referring to FIG. 2, a signal sequence for access to the main blocks MBLK1 to MBLKz may include the normal command CMD_n and the address ADDR indicating one of the main blocks MBLK1 to MBLKz. The control logic 170 may determine whether the main block indicated by the address ADDR is defective on the basis of the repair information, and generate the converted address CA from the externally input address ADDR. When the main block indicated by the address ADDR is normal, or not defective, the converted address CA may be the same as the address ADDR. When the main block indicated by the address ADDR is defective, the address ADDR may be converted to the converted address CA representing one of the redundancy blocks RBLK1 to RBLKn. During the program operation, as illustrated in FIG. 2, the signal sequence for access to the main blocks MBLK1 to MBLKz may further include the data DATA. The data DATA may be transferred to the read and write circuit 150 through the input/output buffer 160.

As a result, the signal sequence for access to the main blocks MBLK1 to MBLKz may include the normal command CMD_n and the address ADDR, and the control logic 170 may compare the address ADDR with the repair information and generate the converted address CA to select one of the redundancy blocks RBLK1 to RBLKn according to a result of comparison.

The signal sequence for access to the guarantee blocks GBLK1 and GBLK2 may include the special command CMD_s without an address for the guarantee blocks GBLK1 and GBLK2. The control logic 170 may generate the guarantee block selection address GSA indicating one between the guarantee blocks GBLK1 and GBLK2 on the basis of the special command CMD_s.

According to an embodiment of the present invention, when one or more of the guarantee blocks GBLK1 and GBLK2 are defective, the address decoder 120 may select one of the redundancy blocks RBLK1 to RBLK for the defective guarantee blocks by using the guarantee block selection address GSA in response to the enabled replacement signal GRP. As a result, the defective block(s) of the guarantee blocks GBLK1 and GBLK2 may be replaced by the redundancy blocks RBLK1 to RBLKn reserved for defective guarantee block(s). Therefore, when the guarantee blocks GBLK1 and GBLK2 are used to store security data and thus should not be failed, a defective guarantee block may be replaced by the redundancy blocks RBLK1 to RBLKn reserved for the defective guarantee block, and thus the semiconductor memory device 100 may be treated as normal. Thus, the product yield of the semiconductor memory device may be improved.

According to an exemplary embodiment, the semiconductor memory device 100 may be a flash memory device.

FIG. 3 is a flowchart illustrating a method of operating the semiconductor memory device 100 according to an embodiment of the present invention.

Referring to FIGS. 1 to 3, at step S110, the command CMD may be input from the external device. At step S120, it may be determined whether the command CMD is for access to a guarantee block, or whether the command CMD is the special command CMD_s. When the command CMD is not for access to the guarantee block, or the command CMD is not the special command CMD_s, step S130 may be performed. When the command CMD is for access to the guarantee block or the command CMD is the special command CMD_s, step S150 may be performed.

At step S130, the converted address CA may be generated based on the address ADDR included in the signal sequence for access to the main blocks MBLK1 to MBLKz. At step S140, one of the main blocks MBLK1 to MBLKz and the redundancy blocks RBLK1 to RBLKn may be selected in response to the converted address CA.

At step S150, the guarantee block selection address GSA may be generated on the basis of the special command CMD_s. For example, when the special command CMD_s is a first command, the guarantee block selection address GSA indicating the first guarantee block GBLK1 may be generated. When the special command CMD_s is a second command, the guarantee block selection address GSA indicating the second guarantee block GBLK2 may be generated.

At step S160, it may be determined whether the replacement signal GRP is enabled. The replacement signal GRP is enabled when one or more of the guarantee blocks GBLK1 and GBLK2 are defective.

At step S170, when the replacement signal GRP is enabled, one of the redundancy blocks RBLK1 to RBLKn may be selected on the basis of the guarantee block selection address GSA. At step S180, when the replacement signal GRP is disabled, one of the guarantee blocks GBLK1 and GBLK2 may be selected on the basis of the guarantee block selection address GSA.

Figure 4:
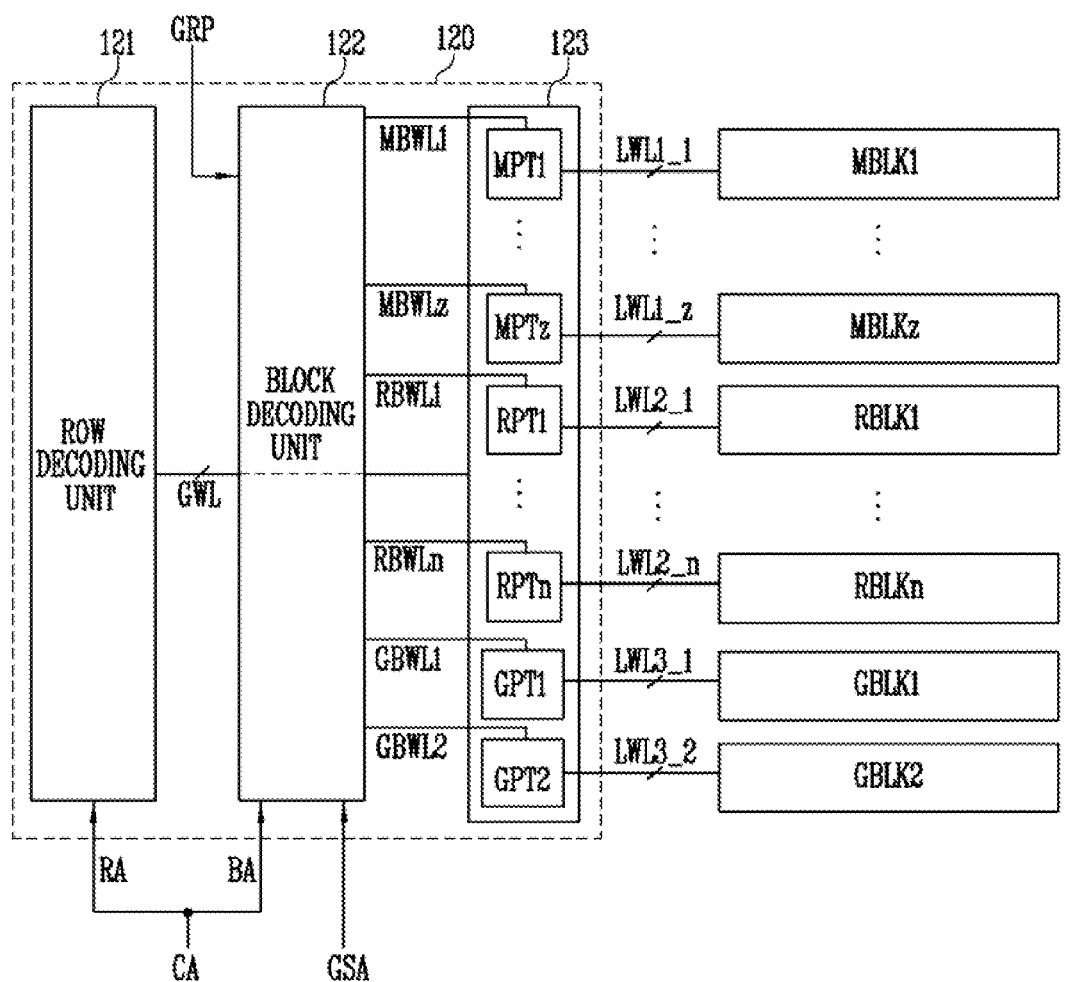
FIG. 4 is a detailed block diagram illustrating an address decoder shown in FIG. 1.

FIG. 4 is a detailed block diagram illustrating the address decoder 120 of FIG. 1.

Referring to FIG. 4, the address decoder 120 may include a row decoding unit 121, a block decoding unit 122 and pass transistor groups 123.

The row decoding unit 121 may receive a row address RA in the converted address CA. The row decoding unit 121 may decode the row address RA to select global word lines GWL.

The block decoding unit 122 may receive a block address BA in the converted address CA. The block decoding unit 122 may decode the block address BA and enable one of the first to z-th main block word lines MBWL1 to MBWLz and the first to n-th redundancy block word lines RBWL1 to RBWLn in response to the decoded block address BA.

In addition, the block decoding unit 122 may receive the guarantee block selection address GSA and the replacement signal GRP.

The block decoding unit 122 may enable one of the first and second guarantee block word lines GBWL1 and GBWL2 in response to the guarantee block selection address GSA when the replacement signal GRP is disabled.

The block decoding unit 122 may enable one of the first and second redundancy block word lines RBWL1 and RBWL2, which correspond to the first and second redundancy blocks RBLK1 and RBLK2 reserved for the guarantee blocks GBLK1 and GBLK2, based on the guarantee block selection address GSA when the replacement signal GRP is enabled.

The pass transistor groups 123 may include main pass transistor groups MPT1 to MPTz, redundancy pass transistor groups RPT1 to RPTn and guarantee pass transistor groups GPT1 and GPT2. The first to z-th main pass transistor groups MPT1 to MPTz may be activated in response enablement of the first to z-th main block word lines MBWL1 to MBWLz, respectively. The first to n-th redundancy pass transistor groups RPT1 to RPTn may be activated in response to enablement of the first to n-th redundancy block word lines RBWL1 to RBWLn, respectively. The first and second guarantee pass transistors GPT1 and GPT2 may be activated in response to enablement of the first and second guarantee block word lines GBWL1 and GBWL2, respectively.

The pass transistor groups 123 may be coupled between the global word lines GWL and corresponding local word lines, respectively. The first to z-th main pass transistor groups MPT1 to MPTz may be coupled to first to z-th local word lines LWL1_1 to LWL1_z of the main blocks MBLK1 to MBLKz, respectively. The first to n-th redundancy pass transistor groups RPT1 to RPTn may be coupled to first to n-th local word lines LWL2_1 to LWL2_n of the redundancy blocks RBLK1 to RBLKn, respectively. The first and second guarantee pass transistor groups GPT1 and GPT2 may be coupled to first and second local word lines LWL3_1 and LWL3_2 of the guarantee blocks GBLK1 and GBLK2, respectively.

When the pass transistor groups are activated, the global word lines GWL and the corresponding local word lines may be electrically coupled to each other. The local word lines may be biased by voltages of the global word lines GWL. In other words, a memory block may be selected by enabling a corresponding local word line.

Figure 5:
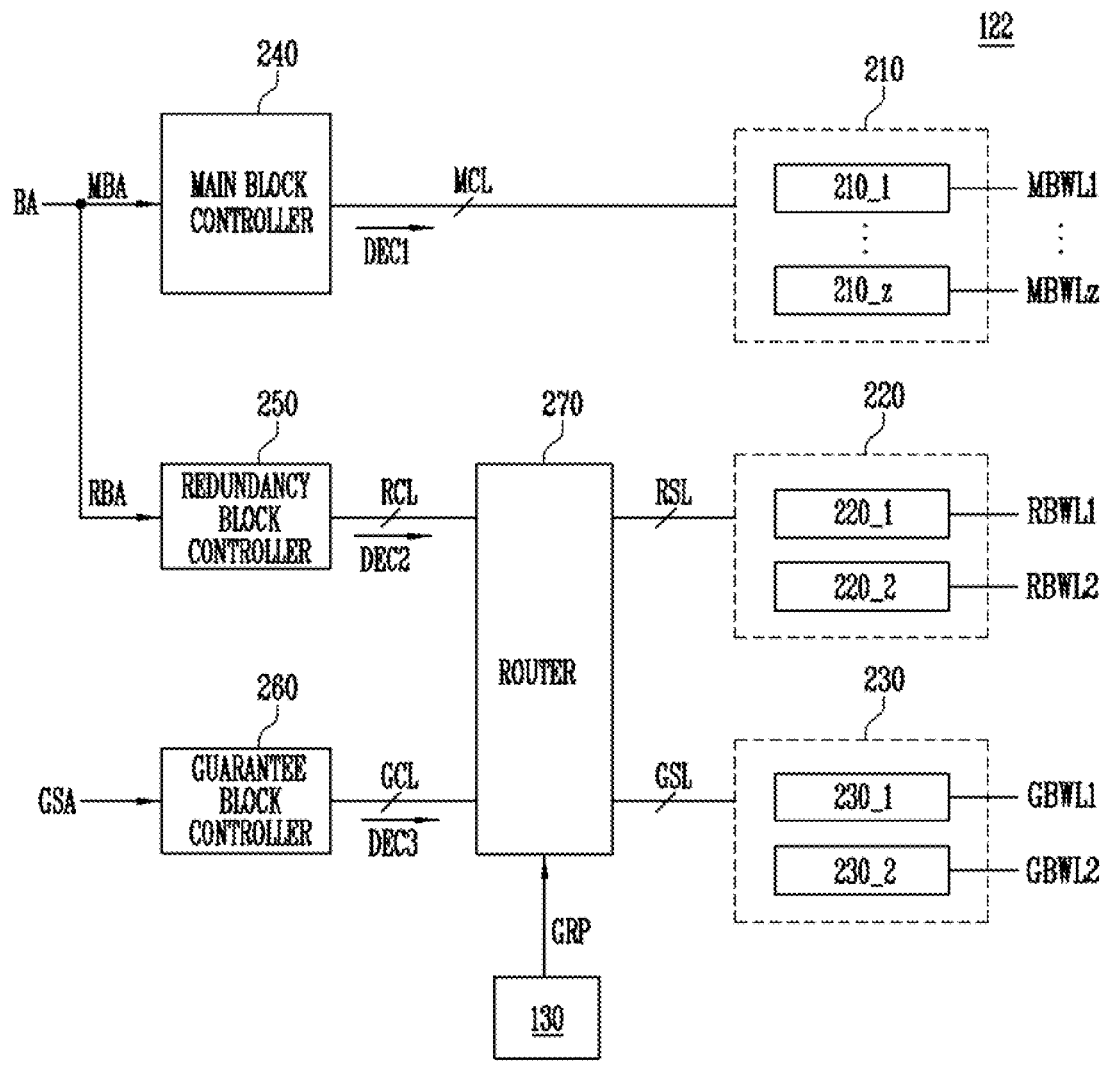
FIG. 5 is a block diagram illustrating a block decoding unit shown in FIG. 4.

FIG. 5 is a block diagram illustrating the block decoding unit 122 shown in FIG. 4.

Referring to FIGS. 4 and 5, the block decoding unit 122 may include a main block selector 210, a redundancy block selector 220, a guarantee block selector 230, a main block controller 240, a redundancy block controller 250, a guarantee block controller 260 and a router 270.

The main block selector 210 may include first to z-th main block selection portions 210_1 to 210_z. The first to z-th main block selection portions 210_1 to 210_z may enable one of the first to z-th main block word lines MBWL1 to MBWLz in response to first decoding signals DEC1, which are transferred from the main block controller 240 through main block control lines MCL. Each of the first to z-th main block selection portions 210_1 to 210_z may be coupled to one or more of the main block control lines MCL, and may selectively enable the corresponding one of the first to z-th main block word lines MBWL1 to MBWLz in response to the first decoding signals DEC1, thereby selecting the corresponding main block.

The redundancy block selector 220 may include redundancy block selection portions 220_1 and 220_2. According to an embodiment, the third to n-th redundancy blocks RBLK3 to RBLKn may be reserved for the main blocks MBLK1 to MBLKz, and the first and second redundancy blocks RBLK1 and RBLK2 may be reserved for the main blocks MBLK1 to MBLKz and the guarantee blocks GBLK1 and GBLK2 as described below. FIG. 5 does not show the third to n-th redundancy block selection portions RBWL3 to RBWLn for selecting the third to n-th redundancy blocks RBLK3 to RBLKn to provide clearer illustration.

The first and second redundancy block selection portions 220_1 and 220_2 may enable one of the first and second redundancy block word lines RBWL1 and RBWL2 in response to second decoding signals DEC2, which are transferred from the redundancy block controller 240 through redundancy selection lines RSL, and may selectively enable the corresponding one of the first and second redundancy block word lines RBWL1 and RBWL2 in response to the second decoding signals DEC2, thereby selecting the corresponding redundancy block, which is to be substituted for a defective one of the main blocks MBLK1 to MBLKz.

Further, the first and second redundancy block selection portions 220_1 and 220_2 may enable one of the first and second redundancy block word lines RBWL1 and RBWL2 in response to third decoding signals DEC3, which are transferred from the guarantee block controller 260 through guarantee selection lines GSL, and may selectively enable the corresponding one of the first and second redundancy block word lines RBWL1 and RBWL2 in response to the third decoding signals DEC3, thereby selecting the corresponding redundancy block, which is to be substituted for a defective one of the guarantee blocks GBLK1 and GBLK2.

As described later, the router 270 may control transfer of the third decoding signals DEC3 selectively to one of the redundancy block selector 220 and the guarantee block selector 230 in response to the replacement signal GRP.

The guarantee block selector 230 may include first and second guarantee block selection portions 230_1 and 230_2. The first and second guarantee block selection portions 230_1 and 230_2 may be coupled to the first and second guarantee block word lines GBWL1 and GBWL2, respectively. The first and second guarantee block selection portions 230_1 and 230_2 may enable one of the first and second guarantee block word lines GBWL1 and GBWL2 in response to the third decoding signals DEC3, which are transferred from the guarantee block controller 260 through the guarantee block selection lines GSL.

The main block controller 240 and the redundancy block controller 250 may receive the block address BA included in the converted address CA shown in FIG. 1. The block address BA may include a rain block address MBA and a redundancy block address RBA. For example, the block address BA may include a plurality of bits, part of which may represent the main block address MBA, and other part of which may represent the redundancy block address RBA.

The main block controller 240 may receive a main block address MBA in the block address BA. The main block controller 240 may generate the first decoding signals DEC1 by decoding the main block address MBA, and transfer the first decoding signals DEC1 as the decoded main block address MBA to the main block control lines MCL. One of the first to z-th block word lines MBWL1 to MBWLz may be enabled in response to the first decoding signals DEC1. When the block address BA indicates one of the first and second redundancy blocks RBLK1 and RBLK2, none of the first to z-th block word lines MBWL1 to MBWLz may be enabled in response to the first decoding signals DEC1.

The redundancy block controller 250 may receive a redundancy block address RBA in the block address BA. The redundancy block controller 250 may generate the second decoding signals DEC2 by decoding the redundancy block address RBA, and transfer the second decoding signals DEC2 as the decoded redundancy block address RBA to redundancy control lines RCL. One of the first and second redundancy block word lines RBWL1 and RBWL2 may be enabled in response to the second decoding signals DEC2. When the block address BA indicates one of the first and second redundancy blocks RBLK1 and RBLK2, one of the first and second redundancy block word lines RBWL1 and RBWL2 may be enabled in response to the second decoding signals DEC2.

The guarantee block controller 260 may receive the guarantee block selection address GSA. For example, as illustrated in FIG. 1, when the two guarantee blocks GBLK1 and GBLK2 are provided, the guarantee block selection address GSA may comprise 1 bit. When the guarantee block selection address GSA is generated, it may mean that the special command CMD_s, shown in FIG. 2, is an input. According to an embodiment, the guarantee block selection address GSA may have a logic value "high" or a logic value "low."

The guarantee block controller 260 may generate the third decoding signals DEC3 by decoding the guarantee block selection address GSA, and transfer the third decoding signals DEC3 as the decoded guarantee block selection address GSA through guarantee block control lines GCL. One of the first and second guarantee block word lines GBWL1 and GBWL2 may be enabled in response to the third decoding signals DEC3. When the guarantee block selection address GSA indicates one of the first and second guarantee blocks GBLK1 and GBLK2, one of the first and second guarantee block word lines GBWL1 and GBWL2 may be enabled in response to the third decoding signals DEC3.

The router 270 may control transfer of the third decoding signals DEC3 selectively to either the redundancy block selector 220 or the guarantee block selector 230 in response to the replacement signal GRP input from the repair logic 130. The router 270 may include a first input terminal coupled to the guarantee block control lines GCL, a second input terminal coupled to the redundancy block control lines RCL, a first output terminal coupled to the guarantee block selection lines GSL and a second output terminal coupled to the redundancy block selection lines RSL.

When the replacement signal GRP is disabled, the router 270 may electrically couple the guarantee block control lines GCL and the guarantee block selection lines GSL to each other, and electrically couple the redundancy block control lines RCL and the redundancy block selection lines RSL to each other. The second decoding signals DEC2 may be transferred to the redundancy block selector 220. The third decoding signals DEC3 may be transferred to the guarantee block selector 230. In other words, when the replacement signal GRP is disabled, the first and second redundancy blocks RBLK1 and RBLK2 may be used to replace the main blocks MBLK1 to MBLKz.

When the replacement signal GRP is enabled, the router 270 may electrically couple the guarantee block control lines GCL and the redundancy block selection lines RSL to each other and transfer the third decoding signals DEC3, input through the guarantee block control lines GCL, to the redundancy block selection lines RSL. The third decoding signals DEC3 may be transferred to the redundancy block selection portions 220_1 and 220_2. The third decoding signals DEC3 may not be transferred to the guarantee block selection lines GSL. For example, the logic value "low" may be transferred to each of the guarantee block selection lines GSL. The redundancy block selection portions 226_1 and 220_2 may select one of the first and second redundancy block word lines RBWL1 and RBWL2 in response to the third decoding signals DEC3.

Figure 6:
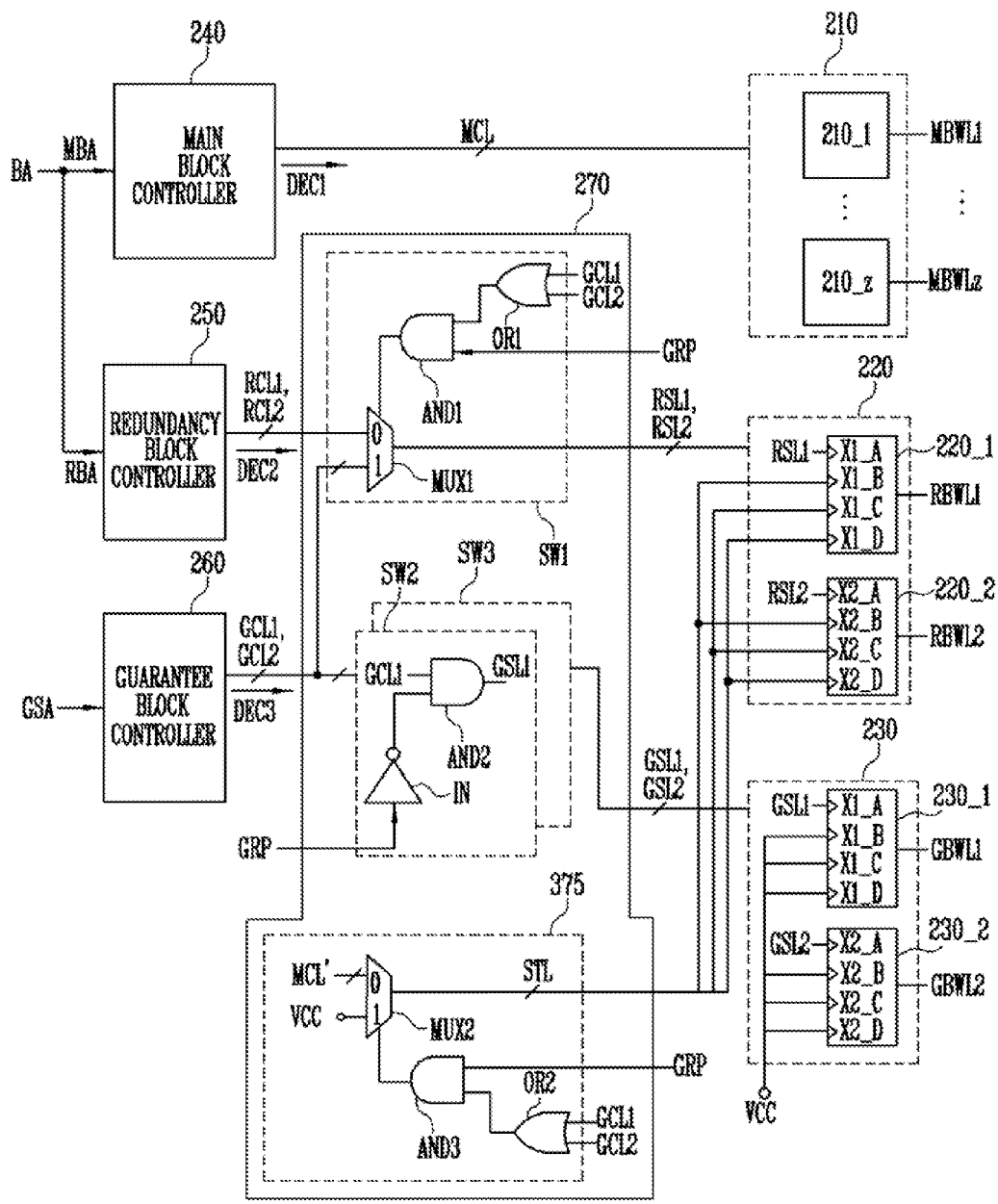
FIG. 6 is a detailed block diagram illustrating the block decoding unit shown in FIG. 5.

FIG. 6 is a detailed block diagram illustrating the block decoding unit 122 shown in FIG. 5.

Referring to FIG. 6, the router 270 may include first to third switching units SW1 to SW3 and a setting unit 375.

The first switching unit SW1 may selectively couple first and second redundancy block control lines RCL1 and RCL2 or first and second guarantee block control lines GCL1 and GCL2 to the redundancy block selector 220 through first and second redundancy block selection lines RSL1 and RSL2, in response to the third decoding signals DEC3 and the replacement signal GRP.

That is, in response to the third decoding signals DEC3 and the replacement signal GRP, the first switching unit SW1 may transfer the third decoding signals DEC3 from the first and second guarantee block control lines GCL1 and GCL2 to the redundancy block selection lines RSL1 and RSL2, or transfer the second decoding signals DEC2 from the first and second redundancy block control lines RCL1 and RCL2 to the redundancy block selection lines RSL1 and RSL2.

The first switching unit SW1 may include a first OR gate OR1, a first AND gate AND1 and a first multiplier MUX1.

The first OR gate OR1 may receive the third decoding signals DEC3 through the first and second guarantee block control lines GCL1 and GCL2 to perform OR operation to the third decoding signals DEC3. When one or more bits of the third decoding signals DEC3 have a logic value "high," the first OR gate OR1 may output a logic value "high," which means that the special command CMD_s for access to the guarantee blocks GBLK1 and GBLK2 is input and the guarantee block selection address GSA is generated.

The first AND gate AND1 may receive and perform AND operation to the replacement signal GRP and the output of the first OR gate OR1. The replacement signal GRP may be enabled with a logic value "high" and disabled with a logic value "low." When the output signal of the first OR gate OR1 has a logic value "high" and the replacement signal GRP has a logic value "high," the first AND gate AND1 may output a logic value "high," which means that the replacement signal GRP is enabled and the guarantee block selection address GSA is generated, or that one or more of the first and second guarantee blocks GBLK1 and GBLK2 are defective, and the defective guarantee block is to be accessed.

When the first AND gate AND1 outputs a logic value "low," it may mean that the replacement signal GRP is disabled or the guarantee block selection address GSA is not generated even when the replacement signal GRP is enabled. For example, when the replacement signal GRP is disabled, the first AND gate AND1 may output a logic value "low." For example, even when the replacement signal GRP is enabled, the first AND gate AND1 may output a logic value "low" if the normal command CMD_n for access to the first to z-th main blocks MBLK1 to MBLKz is input.

The first multiplier MUX1 may electrically couple the first and second guarantee block control lines GCL1 and GCL2 and the redundancy block selection lines RSL1 and RSL2 to each other when the first AND gate AND1 outputs a logic value "high." The first multiplier MUX1 may electrically couple the first and second redundancy block control lines RCL1 and RCL2 and the redundancy block selection lines RSL1 and RSL2 to each other when the first AND gate AND1 outputs the logic value "low."

The second switching unit SW2 may be coupled between the first guarantee block control line GCL1 and the first guarantee block selection line GSL1 and control transfer of the third decoding signals DEC3 from the first guarantee block control line GCL1 to the first guarantee block selection line GSL1, in response to the replacement signal GRP.

The second switching unit SW2 may include an inverter IV and a second AND gate AND2. The inverter IV may receive the replacement signal GRP. The inverter IV may output a logic value "low" when the replacement signal GRP is enabled and output a logic value "high" when the replacement signal GRP is disabled.

The second AND gate AND2 may receive and perform AND operation to the third decoding signals DEC3 and the inverted replacement signal GRP. The second AND gate AND2 may output a logic value "low" to the first guarantee block selection line GSL1 when the inverter IV outputs a logic value "low". In addition, the second AND gate AND2 may transfer the third decoding signals DEC3, which are input through the first guarantee block control line GCL1, to the first guarantee block selection line GSL when the inverter IV outputs the logic value "high."

As a result, the third decoding signals DEC3 may be selectively transferred from the first guarantee block control line GCL1 to the first guarantee block selection line GSL1, in response to the replacement signal GRP. The third decoding signals DEC3 may be cut off when the replacement signal GRP is enabled, and may be transferred to the first guarantee block selection line GSL1 when the replacement signal GRP is disabled.

The third switching unit SW3 may be the same as the second switching unit SW2, except that the third switching unit SW3 is coupled between the second guarantee block control line GCL2 and the second guarantee block selection line GSL2. When the replacement signal GRP is enabled, the third switching unit SW3 may electrically block the third decoding signals DEC3, which are input through the second guarantee block control line GCL2. When the replacement signal GRP is disabled, the third switching unit SW3 may transfer the third decoding signals DEC3, input through the second guarantee block control line GCL2, to the second guarantee block selection line GSL2.

The setting unit 375 may set the redundancy block selection portions 220_1 and 220_2 so that the redundancy blocks RBLK1 and RBLK2 may replace the main blocks MBLK1 to MBLKz or the guarantee blocks GBLK1 and GBLK2.

The setting unit 375 may electrically couple lines MCL' (for example, three lines selected from main block control lines MCL) which are selected from the main block control lines MCL and a power voltage VCC to setting lines STL. A setting signal input through the some lines MCL' may represent that one or more of the first and second redundancy blocks RBWL1 and RBWL2 are substituted for the defective guarantee blocks or the defective main blocks. When one or more of the first and second redundancy blocks RBWL1 and RBWL2 are substituted for the defective guarantee blocks, one or more bits of the setting signal input through the some lines MCL' may have a logic value "low." When the replacement signal GRP is enabled and one of the first and second guarantee block control lines GCL1 and GCL2 has a logic value "high", the setting unit 375 may provide the power voltage VCC to the setting lines STL. When the replacement signal GRP is enabled while the first and second guarantee block control lines GCL1 and GCL2 have a logic value "low" the setting unit 375 may electrically couple some lines MCL' of the main block control lines MCL, to the setting lines STL.

The setting unit 375 may include a second OR gate OR2, a third AND gate ANDS and a second multiplier MUX2.

The second OR gate OR2 may receive the third decoding signals DEC3 through the first and second guarantee block control lines GCL1 and GCL2 to perform OR operation to the third decoding signals DEC3. When one or more bits of the third decoding signals DEC3, input through the first and second guarantee block control lines GCL1 and GCL2, have a logic value "high," the first OR gate OR1 may output a logic value "high," which means that the special command CMD_s for access to the guarantee blocks GBLK1 and GBLK2 is input and the guarantee block selection address GSA is generated. The second OR gate OR2 may output a logic value "low" when the normal command CMD_n for access to the first to z-th main blocks MBWL1 to MBWLz is input.

The third AND gate AND3 may receive and perform AND operation to the replacement signal GRP and the output of the second OR gate OR2. The replacement signal GRP may be enabled with a logic value "high" and disabled with a logic value "low." When the output signal of the second OR gate OR2 has a logic value "high" and the replacement signal GRP has a logic value "high," the third AND gate AND3 may output a logic value "high," which means that the replacement signal GRP is enabled and the guarantee block selection address GSA is generated, or that one or more of the first and second guarantee blocks GBLK1 and GBLK2 are defective, and the defective guarantee block is to be accessed.

When the third AND gate AND3 outputs a logic value "low," it may mean that the replacement signal GRP is disabled or the guarantee block selection address GSA is not generated even when the replacement signal GRP is enabled. For example, when the replacement signal GRP is disabled, the third AND gate AND3 may output a logic value "low." Even when the replacement signal GRP is enabled, the third AND gate AND3 may output a logic value "low" if the normal command CMD_n for access to the first to z-th main blocks MBLK1 to MBLKz is input.

The second multiplier MUX2 may electrically couple the lines MCL' of the main block control lines MCL to the setting lines STL when the third AND gate AND3 outputs a logic value "low." In other words, when the replacement signal GRP is disabled, or when the third decoding signals DEC3 of the first and second guarantee block control lines GCL1 and GCL2 have a logic value "low," the setting lines STL may be electrically coupled to the lines MCL' of the main block control lines MCL. The second multiplier MUX2 may provide the power voltage VCC to the setting lines STL when the third AND gate AND3 outputs a logic value "high." In other words, when the replacement signal GRP is enabled, and one or more bits of the third decoding signals DEC3 of the first and second guarantee block control lines GCL1 and GCL2 have a logic value "high," the power voltage VCC may be provided to the setting lines STL.

The first to z-th main block selection portions 210_1 to 210_z may selectively enable the first to z-th main block word lines MBWL1 to MBWLz in response to the first decoding signals DEC1, which are input through the main block control lines MCL.

Each of the first and second redundancy block selection portions 220_1 and 220_2 may include a plurality of input terminals. A first input terminal X1_A of the first redundancy block selection portion 221 may be coupled to the first redundancy block selection line RSL1, and second and fourth input terminals X1_B to X1_D of the first redundancy block selection portion 221 may be coupled to the setting lines STL. A first input terminal X2_A of the second redundancy block selection portion 222 may be coupled to the second redundancy block selection line RSL2, and second and fourth input terminals X2_B to X2_D of the second redundancy block selection portion 222 may be coupled to the setting lines STL.

Each of the redundancy block selection portions 220_1 and 220_2 may enable a corresponding one of the first and second redundancy block word lines RBWL1 and RBWL2 in response to input signals from the first and second redundancy block selection lines RSL1 and RSL2 and the setting lines STL, all of which have a logic value "high."

When the replacement signal GRP is enabled, the guarantee block selection address GSA is generated, and the third decoding signals DEC3 are provided, the power voltage VCC may be applied to the setting lines STL. When the first and second redundancy block selection lines RSL1 and RSL2 have a logic value "high" and a logic value "low," respectively, the first redundancy block word line RBWL1 may be enabled and the second redundancy block word line RBWL2 may be disabled. When the first and second redundancy block selection lines RSL1 and RSL2 have a logic value "low" and a logic value "high," respectively, the first redundancy block word line RBWL1 may be disabled and the second redundancy block word line RBWL2 may be enabled.

When the replacement signal GRP is disabled, the setting lines STL may be electrically coupled to the lines MCL' of the main block control lines MCL. Each of the redundancy block selection portions 220_1 and 220_2 may selectively enable the corresponding one of the first and second redundancy block word lines RBWL1 and RBWL2 in response to input signals from the first and second redundancy block selection lines RSL1 and RSL2 and the setting lines STL. For example, when one or more of the first and second redundancy blocks RBWL1 and RBWL2 are substituted for the defective main blocks, the setting signal input through the some lines MC may have a logic value "high." In other words, when both the guarantee blocks GBLK1, GBLK2 are not defective, the first and second redundancy blocks RBLK1 and RBLK2 may replace the main blocks MBLK1 to MBLKz.

The first and second guarantee block selection portions 230_1 and 230_2 may include a plurality of input terminals. The first input terminal X1_A of the first guarantee block selection portion 231 may be coupled to the first guarantee block selection line GSL1, and the first input terminal X2_A of the second guarantee block selection portion 232 may be coupled to the second guarantee block selection line GSL2. The second and fourth input terminals X1_B to X1_D and X2_B to X2_D of the first and second guarantee block selection portions 230_1 and 230_2 may be coupled in common to the power voltage VCS.

Each of the first and second guarantee block selection portions 230_1 and 230_2 may enable a corresponding one of the first and second guarantee block word lines GBWL1 and GBWL2 when the logic value "high" is input to each input terminal.

When the replacement signal GRP is enabled, the first and second guarantee block selection lines GSL1 and GSL2 may have a logic value "low." The first and second guarantee block word lines GBWL1 and GBWL2 may be disabled.

When the replacement signal GRP is disabled, the special command CMD_s is input from the external device, and the guarantee block selection address GSA is generated, the third decoding signals DEC3 may be transferred through the first and second guarantee block selection lines GSL1 and GSL2. When the first and second guarantee block selection lines GSL1 and GSL2 have logic values "high" and "low," respectively, the first guarantee block word line GBWL1 may be enabled, and the second guarantee block word line GBWL2 may be disabled. When the first and second guarantee block selection lines GSL1 and GSL2 have logic values "low" and "high," respectively, the first guarantee block word line GBWL1 may be disabled, and the second guarantee block word line GBWL2 may be enabled.

According to an embodiment of the present invention, when the replacement signal GRP is enabled, the router 270 may transfer the decoding signals DEC3 from the guarantee block controller 260 to the redundancy block selector 220. The redundancy block selector 220 may select one of the first and second redundancy blocks RBLK1 and RBLK2 in response to the transferred decoding signals DEC3. Therefore, the guarantee blocks GBLK1 and GBLK2 may be replaced by the redundancy blocks RBLK1 and RBLK2.

Figure 7:
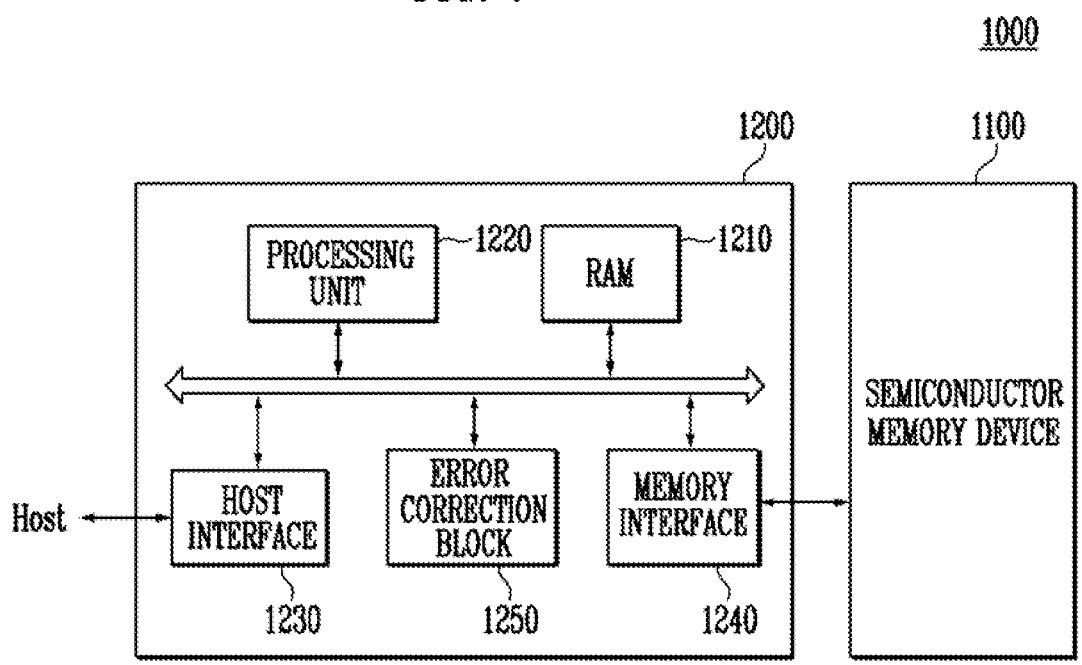
FIG. 7 is a block diagram illustrating a memory system including the semiconductor memory device shown in FIG. 1.

FIG. 7 is a block diagram illustrating a memory system 1000 including the semiconductor memory device 100 shown in FIG. 1.

Referring to FIG. 7, the memory system 1000 may include the semiconductor memory device 100 and a controller 1200.

The semiconductor memory device 100 may be configured and operated in substantially the same manner as described above with reference to FIGS. 1 to 6. Thus, a detailed description thereof will be omitted.

The controller 1200 may be coupled to a host and the semiconductor memory device 100. The controller 1200 may access the semiconductor memory device 100 in response to a request from the host. For example, the memory controller 1200 may control read, write, erase and background operations of the semiconductor memory device 100. The controller 1200 may provide an interface between the semiconductor memory device 100 and the host. The controller 1200 may drive firmware for controlling the semiconductor memory device 100.

The controller 1200 may include random access memory (RAM) 1210, a processing unit 1220, a host interface 1230, a memory interface 1240 and an error correcting code block 1250. The RAM 1210 may function as one source of operation memory of the processing unit 1220, a cache memory between the memory device 200 and the host, and a buffer memory between the semiconductor memory device 100 and the host. The processing unit 1220 may control the general operation of the controller 1200.

The host interface 1230 may include a protocol for data exchange between the host and the controller 1200. According to an exemplary embodiment, the controller 1200 may be configured to communicate with the host through one of various interface protocols including Universal Serial Bus (USB) protocol, multimedia card (MMC) protocol, peripheral component interconnection (PCI) protocol, PCI-express (PCI-E) protocol, Advanced Technology Attachment (ATA) protocol, Serial-ATA protocol, Parallel-ATA protocol, small computer small interface (SCSI) protocol, enhanced small disk interface (ESDI) protocol, Integrated Drive Electronics (IDE) protocol and private protocol.

The memory interface 1240 may include a protocol for communication with the semiconductor memory device 100. For example, the memory interface 1240 may include at least one of flash interfaces, such as a NAND interface and a NOR interface.

The ECC block 1250 may detect an error in data from the semiconductor memory device 100 by using an error correcting code (ECC).

The controller 1200 and the semiconductor memory device 100 may be integrated into a single semiconductor device. In an exemplary embodiment, the controller 1200 and the semiconductor memory device 100 may be integrated into a single semiconductor device to form a memory card. For example, the controller 1200 and the semiconductor memory device 100 may be integrated into a single semiconductor device to form a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or universal flash storage (UFS).

The controller 1200 and the semiconductor memory device 100 may be integrated into a single semiconductor device to form a semiconductor drive (Solid State Drive (SSD)). The semiconductor drive (SSD) may include a storage device configured to store data in a semiconductor memory. When the memory system 1000 is used as the semiconductor drive (SSD), an operating speed of the host coupled to the memory system 1000 may be significantly improved.

In another example, the memory system 1000 may be used as one of various components of an electronic device, such as a computer, an ultra mobile PC (UMPC), a workstation a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device and/or one of various devices for computing systems, etc.

In an exemplary embodiment, the semiconductor memory device 100 or the memory system 1000 may be packaged in a variety of ways. For example, the semiconductor memory device 100 or the memory system 1000 may be packaged using various methods such as package on package (PoP), ball grid arrays (BGAs), chip scale packages (CSPs), plastic leaded chip carrier (PLCC), plastic dual in line package (PDIP), die in waffle pack, a die in wafer form, a chip on board (COB), ceramic dual in line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (VVFP) and/or wafer-level processed stack package (WSP), etc.

Figure 8:
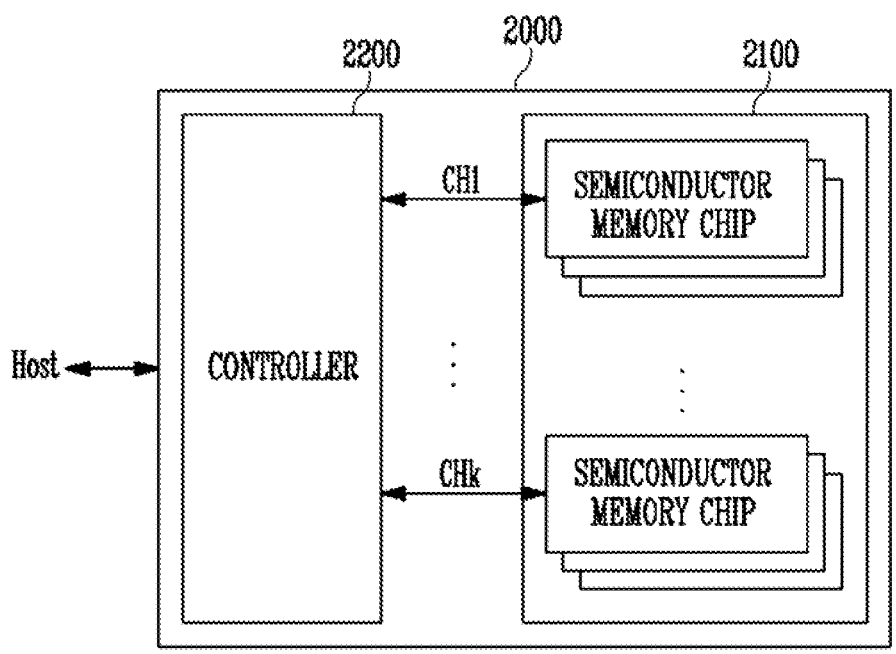
FIG. 8 is a block diagram illustrating an application example of the memory system shown in FIG. 7.

FIG. 8 is a block diagram illustrating an application example (2000) of the memory system shown in FIG. 7.

Referring to FIG. 8, a memory system 2000 may include a semiconductor memory device 2100 and a controller 2200. The semiconductor memory device 2100 may include a plurality of semiconductor memory chips. The semiconductor memory chips may be divided into a plurality of groups.

FIG. 8 illustrates the plurality of groups communicating with the controller 220 through first to k-th channels CH1 to CHk, respectively. Each of the memory chips may be configured and operated in substantially the same manner as the semiconductor memory device 100 described above with reference 1.

Each of the groups may communicate with the controller 2200 through a single common channel. The controller 2200 may be configured in substantially the same manner as the controller 1200 as described above with reference to FIG. 7 and may control the plurality of memory chips of the semiconductor memory device 2100.

FIG. 8 illustrates the plurality of semiconductor memory chips coupled to a single channel. However, the memory system 2000 may be modified so that a single semiconductor memory chip may be coupled to a single channel.

Figure 9:
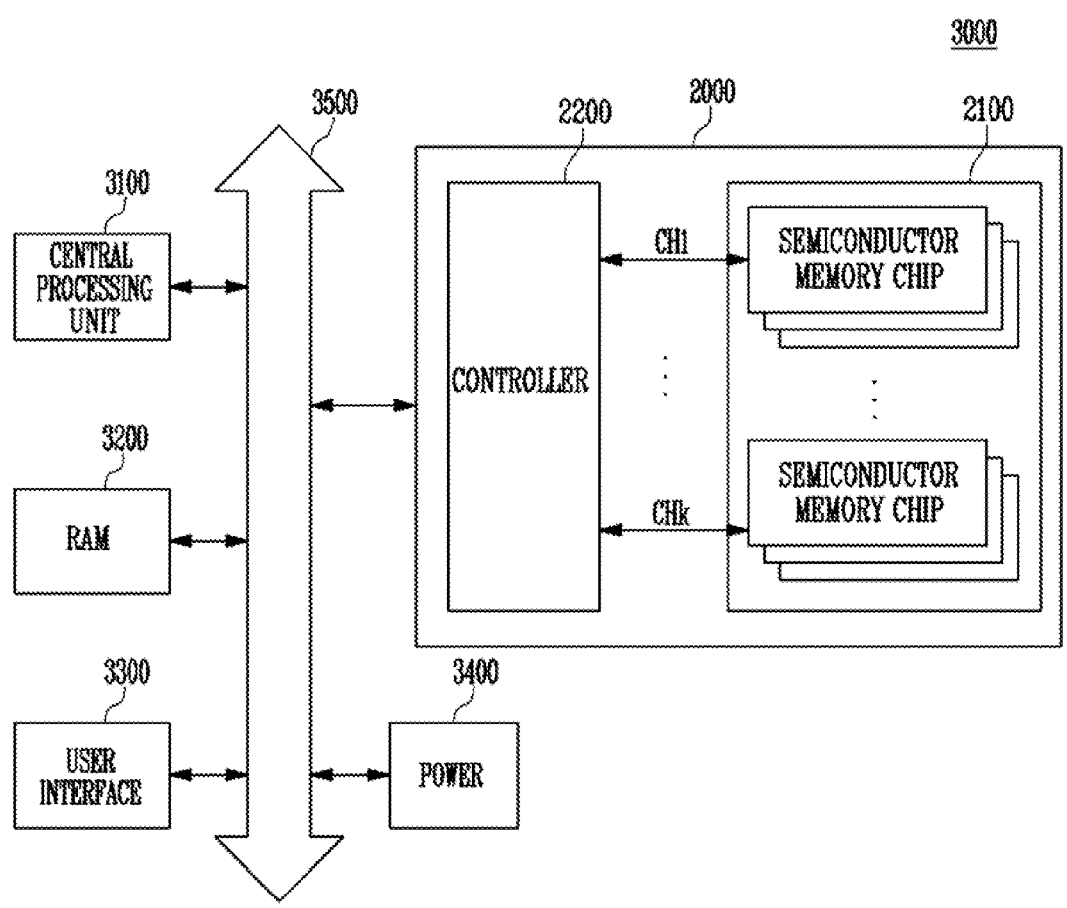
FIG. 9 is a block diagram illustrating a computing system including the memory system described with reference to FIG. 8.

FIG. 9 is a block diagram illustrating a computing system 3000 including the memory system 2000 shown in FIG. 8.

Referring to FIG. 9, the computing system 3000 may include a central processing unit 3100, random access memory (RAM) 3200, a user interface 3300, a power supply 3400, system bus 3500 and the memory system 2000.

The memory system 2000 may be electrically coupled to the central processing unit 3100, the RAM 3200, the user interface 3300 and the power supply 3400 through the system bus 3500. Data provided through the user interface 3300 or processed by the central processing unit 3100 may be stored in the memory system 2000.

FIG. 9 illustrates the semiconductor memory device 2100 coupled to the system bus 3500 through the controller 2200. However, the semiconductor memory device 2100 may be directly coupled to the system bus 3500. Functions of the controller 2200 may be performed by the central processing unit 3100 and the RAM 3200.

FIG. 9 illustrates the memory system 2000 described above with reference to FIG. 8. However, the memory system 2000 may be replaced by the memory system 1000 described above with reference to FIG. 7. In an exemplary embodiment, the computing system 3000 may include both memory systems 1000 and 2000 described above with reference to FIGS. 7 and 8, respectively.

According to embodiments of the present invention, yield of a manufacturing process of a semiconductor memory device may be increased.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor memory device, comprising:
    a memory cell array including a first group of main blocks, a second group of main blocks and redundancy blocks replacing the first group of main blocks or the second group of main blocks;
    a repair logic suitable for enabling a replacement signal when one or more of the second group of main blocks are defective;
    a control logic suitable for generating an address for the second group of main blocks in response to a dedicated command for access to one or more of the second group of main blocks; and
    an address decoder suitable for selecting one or more of the redundancy blocks based on the address for the second group of main blocks when the replacement signal is enabled,
    wherein the address decoder comprises:
    a router suitable for selectively transferring one of the addresses for the first and second groups of main blocks in response to the replacement signal and the address for the second group of main blocks:
    a redundancy block selector selecting one of the redundancy blocks in response to the address for the first or second group of main blocks transferred from the router; and
    a guarantee block selector selecting one of the second group of main blocks in response to the address for the second group of main blocks transferred from the router.

2. The semiconductor memory device of claim 1, wherein the router transfers the address for the second group of main blocks to the redundancy block selector when the replacement signal is enabled, and to the guarantee block selector when the replacement signal is disabled.

3. The semiconductor memory device of claim 1, wherein, according to a command for access to one or more of the first group of main blocks, the router transfers the address for the first group of main blocks to the redundancy block selector according to a defect of the first group of main blocks, and
    further comprising a setting unit suitable for preventing the redundancy block selector from selecting one of the redundancy blocks in response to the address for the first group of main block transferred from the router when the replacement signal is enabled.

4. The semiconductor memory device of claim 3, wherein the router transfers the address for the second group of main blocks to the redundancy block selector when the replacement signal is enabled.

5. The semiconductor memory device of claim 3, wherein the router transfers the address for the first group of main blocks to the redundancy block selector according to a defect of the first group of main blocks, and transfers the address for the second group of main blocks to the guarantee block selector when the replacement signal is disabled.

6. The semiconductor memory device of claim 1, wherein the first group of main blocks stores setup information indicating whether or not one or more of the second group of main blocks are defective, and
    the repair logic enables the replacement signal according to the setup information.

7. A method of operating a semiconductor memory device including main blocks and redundancy blocks for replacing the main blocks, the method comprising:
    receiving a command from an external device;
    determining whether the command is for access to a predetermined part of the main blocks;
    generating a guarantee block selection address indicating the predetermined part of the main blocks depending on a result of determination;
    selecting one of the redundancy blocks according to the guarantee block selection address in response to a replacement signal enabled when at least one of the predetermined parts of the main blocks are defective; and
    storing setup information indicating whether guarantee blocks are defective, in one of the main blocks, and enabling or disabling the replacement signal according to the setup information.

8. The method of claim 7, wherein one of the redundancy blocks is selected in response to the guarantee block selection address when the replacement signal is enabled, and one of the predetermined parts of the main blocks is selected in response to the guarantee block selection address when the replacement signal is disabled.

9. The method of claim 7, wherein the selecting of the one of the redundancy blocks comprises:
    decoding the guarantee block selection address; and
    selecting one of the redundancy blocks in response to a decoded guarantee block selection address.

* * * * *